United States Patent [19]

Green et al.

[11] 4,111,907
[45] Sep. 5, 1978

[54] PHOTOPOLYMERIZABLE KETONES

[75] Inventors: George Edward Green, Cherry Hinton; Bernard Peter Stark, Stapleford; John Sidney Waterhouse, Cherry Hinton, all of England

[73] Assignee: Ciba-Geigy Corporation, Ardsley, N.Y.

[21] Appl. No.: 736,636

[22] Filed: Oct. 28, 1976

[30] Foreign Application Priority Data

Nov. 4, 1975 [GB] United Kingdom ............... 45735/75

[51] Int. Cl.$^2$ ...................... C08G 59/06; C08G 59/14
[52] U.S. Cl. .................................. 260/830 R; 528/221; 528/227; 528/125; 204/159.11; 260/348.15; 260/348.64; 428/413; 96/35.1
[58] Field of Search ........ 260/47 EP, 47 EC, 47 EA, 260/47 EN, 51 EP, 348.15, 348.64

[56] References Cited

U.S. PATENT DOCUMENTS

| | | | |
|---|---|---|---|
| 3,410,824 | 11/1968 | Atkinson | 260/47 |
| 3,824,212 | 7/1974 | Sinnema et al. | 260/47 |
| 3,937,685 | 2/1976 | Kölbel et al. | 260/47 EP |
| 3,996,121 | 12/1976 | Green et al. | 204/159.23 |

Primary Examiner—Harold D. Anderson
Assistant Examiner—E. A. Nielsen
Attorney, Agent, or Firm—Luther A. R. Hall

[57] ABSTRACT

The modified advanced epoxide resins described, having an average molecular weight of up to 50,000, can be photopolymerized without the need to include photosensitizers. They may be prepared by reaction of a diepoxide $$\underset{CH_2-CH-R^1-CH-CH_2}{\overset{O\qquad\qquad O}{\diagup\!\!\!\diagdown\qquad\diagup\!\!\!\diagdown}}$$

with a keto group-containing dihydric phenol $$HO-R^3-OH$$
$$\quad\;\;|$$
$$\;\;COCH_2R^2$$

to form the advanced epoxide resin

[structural formula]

followed by condensation with an aldehyde RCHO to yield

[structural formula]

In the above formulae, R is an organic group which preferably has ethylenic unsaturation or heterocyclic aromaticity in conjugation with the indicated ethylenic double bond; R$^1$ is the divalent residue linking two epoxide groups; R$^2$ is preferably a hydrogen atom but may be an organic group, halogen, or cyano; R$^3$ is a trivalent aromatic or heterocyclic group, especially a group

[benzene ring structure]

If desired, other dihydric phenols can be employed with that containing a keto group, and condensation with the aldehyde may be carried out so that only some groups —COCH$_2$R$^2$ undergo reaction.

19 Claims, No Drawings

PHOTOPOLYMERIZABLE KETONES

BACKGROUND OF THE INVENTION

This invention relates to unsaturated ketones which polymerise on exposure to actinic radiation, to methods of polymerising such ketones by means of actinic radiation and of coating a surface with such ketones, to supports bearing thereon such a ketone in the polymerisable state, and to supports bearing thereon such a ketone polymerised by means of actinic radiation.

Substances capable of becoming polymerised on exposure to actinic radiation are used in, for example, the preparation of printing plates for offset printing and of printed circuits, and for coating metals, such as in the manufacture of cans (see, e.g., Kosar, "Light-sensitive systems: Chemistry and Applications of non-silver halide Photographic processes," Wiley, New York, 1965; Delzenne, "Synthesis and Photocrosslinking of Light-sensitive Polymers" in European Polym. J. Suppl. 1969, pp. 55-91; Williams, "Photopolymerisation and Photocrosslinking of Polymers" in Forschr. Chem. Forsch. Vol. 13 (2), 227-250). There are various drawbacks in the substances presently available which may be polymerised by exposure to actinic radiation. Some are so unstable that they must be applied to a substrate only immediately prior to exposing them to actinic radiation. Others are relatively insensitive and need lengthy exposure to actinic radiation in order to become sufficiently polymerised. Others, after being polymerised, are not resistant to etching baths used in subsequent processes.

Most previously known substances which polymerise on exposure to actinic radiation are used with a sensitiser such as Michler's ketone (bis(p-dimethylamino)-benzophenone), benzoin, or an alkyl ether of benzoin, to shorten the exposure time required for polymerisation. However, the sensitiser alters the electrical properties of the polymer, and may volatilise on being heated under pressure, so making it unsuitable for use in multilayer laminates; in the preparation of these, therefore, the polymer is removed, usually by wire brushing, after the metal etching process has taken place, which removal adds to the cost of the laminates and may cause damage to the surface of the metal.

DETAILED DISCLOSURE

We have now found that these drawbacks can be at least substantially overcome by the use of certain novel unsaturated ketones, in the photopolymerisation of which a photosensitiser is usually not required.

The aforesaid ketones contain a ketonic carbonyl group which links a vinylene group to an aromatic or heterocyclic group, the said aromatic or heterocyclic group forming part of an advanced epoxide resin.

The unsaturated ketones of the present invention may be represented by the formula

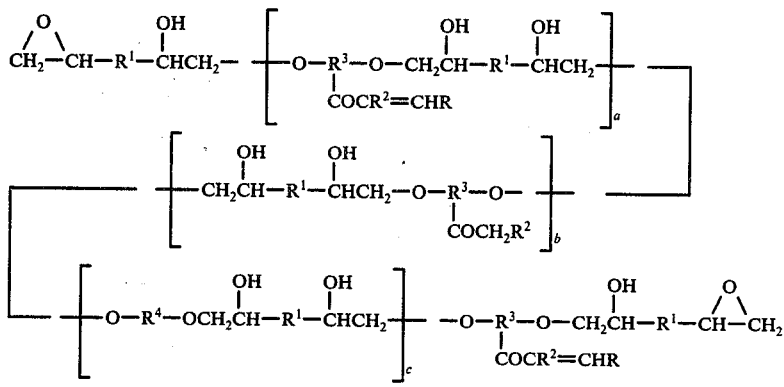

where
R represents a monovalent alkyl, alkenyl, aralkyl, aralkenyl, cycloalkyl, cycloalkenyl, cycloalkylalkyl, cycloalkenylalkyl, cycloalkylalkenyl, cycloalkenylalkenyl, heterocyclic, heterocyclicalkyl, or heterocyclic-alkenyl group of 1 to 20 carbon atoms, preferably such a group having ethylenic unsaturation or heterocyclic aromaticity in conjugation with the indicated ethylenic double bond, $R^1$ represents a divalent residue which links the two epoxide groups of a bis(1,2-epoxide), such as a carbon-carbon bond, but preferably an optionally substituted or interrupted hydrocarbyl residue, and especially such a residue where both the epoxide groups were present in glycidyl groups attached to oxygen, nitrogen, or sulphur atoms, such as a residue of formula $$-CH_2X(OC)_dR^5(CO)_dXCH_2-\qquad II$$

$R^2$ represents a hydrogen atom for preference, but may alternatively represent a chlorine or bromine atom, a cyano group, or an aliphatic, aromatic, cycloaliphatic, araliphatic, cycloaliphatic-aliphatic, heterocyclic, or heterocyclic-aliphatic group of 1 to 10 carbon atoms, $R^3$ represents a trivalent aromatic or heterocyclic group, bound directly through three carbon atoms thereof to the two indicated

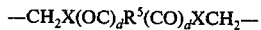

groups and the indicated $-COCR^2=CHR$ group, such as one of from 5 to 20 carbon atoms and containing one or two, optionally fused, benzenoid rings or heterocyclic rings which have $(4n + 2)$ $\pi$-electrons, where $n$ is the number of rings, such as a group of formula

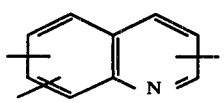 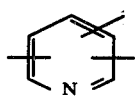

III    IV and especially a group of formula

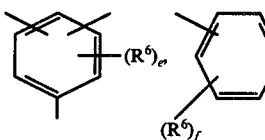 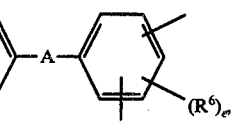

V    VI

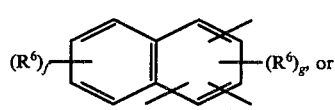

VII

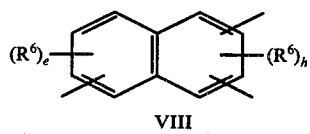

VIII $R^4$ represents the residue, free of any substituents of formula —COCH$_2$R$^2$ or —COCR$^2$=CHR, of a dihydric phenol after removal of both phenolic hydroxyl groups, X represents an oxygen or sulphur atom or a tertiary amino group, $R^5$ represents a divalent aliphatic, aromatic, or heterocyclic group of 2 to 20 carbon atoms, $R^6$ represents a halogen atom or an alkyl, aryl, or aralkyl group, or a group of formula —COCR$^2$=CHR, A represents a carbon-carbon bond, an oxygen or sulphur atom, a carbonyl, sulphonyl, or sulphinyl group, or a divalent aliphatic, aromatic, or araliphatic group of 1 to 10 carbon atoms, a, b, and c each represent zero or an integer such that the average molecular weight of the unsaturated ketone of formula I is from 500 to 50,000, preferably from 2000 to 10,000, both d are zero or, if X represents an oxygen atom, the adjacent d may alternatively represent 1, e represents 0 or an integer of from 1 to 3, f represents 0 or an integer of from 1 to 4, g represents 0 or 1, and h represents 0, 1, or 2.

None of R to $R^6$ and A should contain active hydrogen, that is to say, a hydrogen atom directly attached to an oxygen, nitrogen, or sulphur atom.

U.S. Pat. No. 3,410,824 describes light-sensitive resins having a molecular weight of from about 500 to about 4000, made by reaction of an epoxy prepolymer — such as a bis(1,2-epoxide) — or of epichlorohydrin with a dihydroxychalcone. In the relevant examples, 4,4'-dihydroxydistyryl ketone is used, but various phenyl styryl ketones containing two phenolic hydroxyl groups are listed as alternatives, including 2',4'-dihydroxychalcone, i.e., 2,4-dihydroxyphenyl styryl ketone. Were this particular ketone to be employed, products of the general formula I would be obtained, R representing a phenyl group.

Unpublished experiments by the present inventors have shown, however, that products of the general formula I where R denotes a phenyl group undergo photopolymerisation only very slowly. Thus, the products of Example 4, where R is a 2-furyl group, and of Example 5, where R is a 2-phenylvinyl group, gave good relief images after irradiation for 1 and 2 minutes respectively, whereas to obtain a comparable image from a product made in the same way but employing benzaldehyde, (i.e., R is a phenyl group) necessitated irradiation for 15 minutes.

Particularly preferred ketones of formula I are those wherein $R^3$ represents a group of formula V, e representing zero, especially substituted in the 1,2,4 positions, resacetophenone being readily available, b and c both representing zero, and where the group R has 4 to 10 carbon atoms, especially an aralkyl, aralkenyl, heterocyclic, heterocyclic-alkyl, or heterocyclic-alkenyl group consisting only of carbon and hydrogen atoms and, where appropriate, hetero nitrogen, oxygen, or sulphur atoms, such as a 2-pyridyl, 3-pyridyl, 2-furyl, or phenylvinyl group.

The unsaturated ketones of formula I may be prepared in two stages. The first comprises advancement of a diepoxide of formula

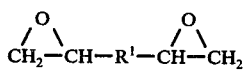    IX with a keto group-containing dihydric phenol of formula

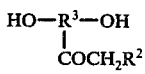    X optionally together with a dihydric phenol of formula

    XI to form the advanced epoxide resin of formula

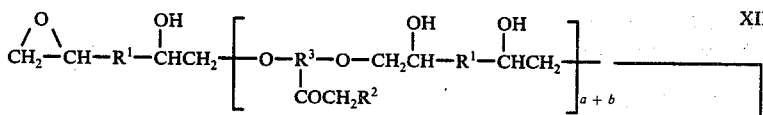

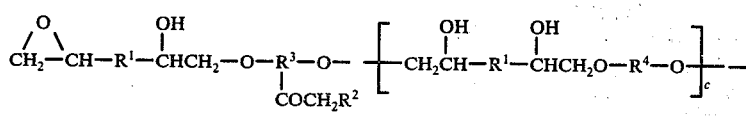

The second stage, which is another aspect of this invention, comprises condensation of this resin with an aldehyde of formula

R—CHO    XIII where $a$, $b$, $c$, and R to $R^4$ are as hereinbefore defined.

Advancement of the diepoxide of formula IX with the dihydric phenol for formula X (and that of formula XI if used), may be carried out under conditions conventional for advancing epoxide resins and is preferably effected at a temperature of from 60° to 200° C, especially at 120° to 170° C, and in the presence of a catalyst for epoxide resin advancement.

Such catalysts are, for example, alkali metal hydroxides such as sodium hydroxide; alkali metal halides such as lithium chloride, potassium chloride, or sodium chloride, bromide, or fluoride; tertiary amines such as triethylamine, tri-n-propylamine, N-benzyldimethylamine, N,N-dimethylaniline, and triethanolamine, quaternary ammonium bases such as benzyltrimethylammonium hydroxide; quaternary ammonium salts (which are the preferred catalysts) such as tetramethylammonium chloride, tetraethylammonium chloride, benzyltrimethylammonium chloride, benzyltrimethylammonium acetate or methyltriethylammonium chloride; and hydrazines having a tertiary nitrogen atoms, such as 1,1-dimethylhydrazine, which can also be employed in their quaternised form. An inert solvent such as 2-ethoxyethanol may be present.

Depending on the choice of the starting substances, the reaction in some cases takes place quantitatively so rapidly that no addition of catalyst is necessary. Whilst the starting materials are generally mixed with one another at room temperature and are then brought to the reaction temperature, it is advantageous in the case of very reactive components if the polyepoxide compound is first introduced and heated by itself to the requisite reaction temperature and the other reaction components are then gradually added in small portions. The progress of the reaction up to the end product having a defined epoxide group content which essentially remains constant can be followed by titration of the epoxide groups using samples taken during the reaction.

Condensation of the advanced epoxide resin of formula XII with the aldehyde of formula XIII may be effected in the presence of an acidic dehydration catalyst such as a mineral acid, for example, sulphuric or phosphoric acids, or acetic anhydride, phosphorus pentoxide, or a toluenesulphonic acid, or of a basic condensation catalyst, such as sodium or potassium hydroxide and particularly an organic base such as a quaternary ammonium base, for example, benzyltrimethylammonium hydroxide, tetramethyl- and tetraethylammonium hydroxide, tetrakis(2-hydroxyethyl)ammonium hydroxide, and benzyltrimethylammonium butoxide, and a sodium or potassium alkoxide. The condensation is preferably carried out in the presence of a diluent, which is conveniently an excess of the aldehyde of formula XIII. Other diluents which may be used include inert solvents such as alkoxyalkanols, cycloalkanones, and halogenated hydrocarbons. At the end of the reaction it is important to ensure that no residual catalyst remains in the product, e.g., by neutralising it with an acid or base, otherwise insolubilisation of the product may occur.

The novel ketones of formula I may also be prepared by an alternative two stage process. The first comprises reaction of a dihydric phenol of formula X with an aldehyde of formula XIII to form the product, of general formula $$\underset{\underset{COCR^2=CHR}{|}}{HO-R^3-OH} \qquad XIV$$

where R, $R^2$, and $R^3$ are as hereinbefore defined. This product, a dihydric phenol, together with, if desired, a dihydric phenol of formula XI, is, according to another aspect of this invention, caused to react with a diepoxide of formula IX to advance it.

The first stage may be effected in the presence of an acidic dehydration or basic condensation catalyst, as listed above, and the second stage may be carried out under conventional advancement conditions, as indicated above, particularly in the presence of a quaternary ammonium salt. If the keto group and one of the hydroxyl groups in the dihydric phenol of formula X are on adjacent carbon atoms of an aromatic ring, the product formed by reaction with the aldehyde usually contains a considerable proportion of flavones; this method is therefore not preferred with such starting materials.

Preferred aldehydes of formula XIII are pyridine-2-aldehyde, pyridine-3-aldehyde, furfuraldehyde, and cinnamaldehyde.

As examples of suitable diepoxides of formula IX may be mentioned diglycidyl esters obtainable by reaction of a compound containing two carboxylic acid groups per molecule with epichlorohydrin or glycerol dichlorohydrin in the presence of an alkali. Such diglycidyl esters may be derived from aliphatic carboxylic acids, e.g. glutaric acid, adipic acid, pimelic acid, suberic acid, azelaic acid, sebacic acid, or dimerised linoleic acid; from cycloaliphatic carboxylic acids such as tetrahydrophthalic acid, 4-methyltetrahydrophthalic acid, hexahydrophthalic acid, and 4-methylhexahydrophthalic acid; and from aromatic carboxylic acids such as phthalic acid, isophthalic acid, and terephthalic acid.

Further examples are glycidyl ethers obtainable by reaction of a compound containing two alcoholic hydroxyl or phenolic hydroxyl groups per molecule with epichlorohydrin or glycerol dichlorohydrin under alkaline conditions, or, alternatively, in the presence of an acidic catalyst and subsequent treatment with alkali. These ethers may be made from acyclic alcohols such as ethylene glycol, diethylene glycol, and higher poly(oxyethylene) glycols, propane-1,2-diol and poly(oxypropylene) glycols, propane-1,3-diol, butane-1,4-diol, poly(oxytetramethylene) glycols, pentane-1,5-diol, and hexane-1,6-diol, from cycloaliphatic alcohols such as resorcitol, quinitol, bis(4-hydroxycyclohexyl)methane, 2,2-bis(4-hydroxycyclohexyl)propane, and 1,1-bis(hydroxymethyl)cyclohex-3-ene; and from alcohols having aromatic nuclei, such as N,N-bis(2-hydroxyethyl)aniline and bis(p-(2-hydroxyethylamino)phenyl)methane: or they may be made from mononuclear phenols, such as resorcinol and hydroquinone, and from polynuclear phenols, such as bis(4-hydroxyphenyl)methane, 4,4'-dihydroxydiphenyl, bis(4-hydroxyphenyl) sulphone, 2,2-bis(4-hydroxyphenyl)propane (otherwise known as bisphenol A) and 2,2-bis(3,5-dibromo-4-hydroxyphenyl)propane.

Suitable di(N-glycidyl) compounds include those obtained by dehydrochlorination of the reaction products of epichlorohydrin with amines containing two amino-hydrogen atoms, such as aniline, n-butylamine, and bis(4-methylaminophenyl)methane; and N,N'-diglycidyl derivatives of cyclic ureas, such as those of hydantoins, uracils, dihydrouracils, parabanic acid, bis(-hydantoin-1-yl)alkanes, ethyleneureas (imidazolidin-2-ones), and 1,3-propyleneureas (hexahydro-2H-pyrimidin-2-ones).

Examples of suitable di(S-glycidyl) compounds are di-S-glycidyl derivatives of dithiols such as ethane-1,2-dithiol and bis(4-mercaptomethylphenyl)ether.

Epoxide resins having the glycidyl groups attached to different kinds of hetero atoms may be employed, e.g., the glycidyl ether-glycidyl ester of salicylic acid and N-glycidyl-N'-(2-glycidyloxypropyl)-5,5-dimethylhydantoin.

Diepoxides containing photopolymerisable groups may also be used similarly to prepare the unsaturated ketones of the present invention, such as those where $R^1$ in formula IX denotes a chain of carbon atoms containing a grouping

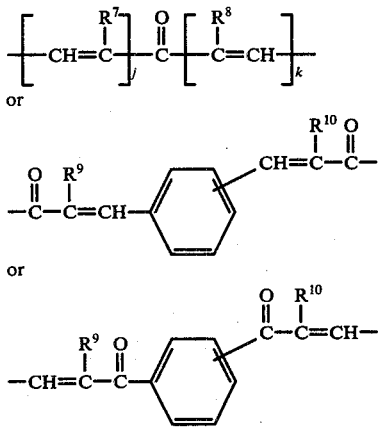

where
$R^7$ and $R^8$ individually are each a hydrogen atom, an alkyl group of 1 to 4 carbon atoms, or a phenyl group, and conjointly denote a polymethylene chain of 2 to 4 methylene groups, $R^9$ and $R^{10}$ are each a hydrogen atom, an alkyl group of 1 to 4 carbon atoms, or a phenyl group, and $j$ and $k$ are each 0, 1, or 2, but cannot both be 0, a typical specific example being 1,5-bis(4-glycidyloxyphenyl)penta-1,4-dien-3-one.

The unsaturated ketones of the present invention are polymerised by exposure to actinic radiation, preferably of wavelength 200–600 nm. If desired, the irradiated material may then be crosslinked through the epoxide groups by treatment with a polycarboxylic acid anhydride or other heat-curing agent for epoxide resins, especially a latent curing agent, e.g., one which has little or no effect at room temperature but which rapidly induces crosslinking when a certain threshold temperature is exceeded, e.g. dicyandiamide, a boron difluoride chelate, or a complex of a tertiary amine with boron trifluoride or boron trichloride. Such additional cross-linking, which is usually carried out at a temperature in the range 100° to 200° C, often enhances the adhesion of the polymerised composition to the support.

The unsaturated ketones of this invention are of particular value in the production of printing plates and printed circuits, especially multilayer printed circuits which can be prepared without removal of the photopolymerised ketone. A layer of the ketone may be applied to a support by coating the support with a solution of the ketone in any convenient solvent, e.g., cyclohexanone, 2-ethoxyethanol, or a mixture of toluene and acetone or ethyl methyl ketone, and allowing or causing the solvent to evaporate. The layer may be applied by dipping, spinning (i.e., spin-coating, a process in which the material is put on a plate which is then rotated at high speed to distribute the the material over it), by spraying, or by means of a roller.

This invention also includes a plate sensitive to actinic radiation comprising a support, which may be of, for example, paper, copper, aluminium or other metal, synthetic resin, or glass, carrying a layer of such a ketone, and also if desired a heat-curing agent for epoxide resins. It provides also a support bearing upon its surface such a ketone which has been polymerised by exposure to actinic radiation and further, if desired, crosslinked by means of a heat-curing agent for epoxide resins. It also provides a method of polymerising such a ketone which comprises subjecting a plate carrying a layer of the ketone to actinic radiation, optionally imagewise as through a negative, and removing the unpolymerised portions, if any, of the ketone by means of a solvent.

The coating of the ketone should be applied to the support so that, upon drying, its thickness will be in the range of from about 1 to 250 μm. The thickness of the polymerisable layer is a direct function of the thickness desired in the relief image, which will depend on the subject being reproduced and particularly on the extent of the non-printing areas. The wet polymer coating may be dried by air drying or by any other known drying technique, and the polymerisable system may then be stored until required for use.

The polymerisable coatings can be insolubilised by exposure to actinic radiation through an image-bearing transparency consisting of substantially opaque and transparent areas. Suitable sources of actinic radiation include carbon arcs, mercury vapour arcs, fluorescent lamps with phosphors emitting ultra-violet light, argon and xenon glow lamps, tungsten lamps, and photographic flood lamps. Of these, mercury vapour arcs, particularly sun lamps, fluorescent sun lamps, and metal halide lamps are most suitable. The time required for the exposure of a ketone will depend upon a variety of factors which include, for example, the individual ketone being utilised, the thickness of the coating, the type of light source, and its distance from the coating.

Subsequent to the exposure the coatings are "developed" by being washed with a suitable liquid, such as perchloroethylene, methylene chloride, ethylene dichloride, chloroform, acetone, ethyl methyl ketone, cyclohexanone, n-propanol, ethanol, toluene, benzene, ethyl acetate, and mixtures thereof, to dissolve and remove that portion of the coating which was not polymerised by exposure to actinic radiation. Liquids used for this operation must be selected with care since they should have good solvent action on the unexposed areas yet have little effect upon either the polymerised ketone or the substrate. The developing solvent should normally be allowed to remain in contact with the coating for from about 30 seconds to 3 minutes, depending upon which solvent is utilized. The developed polymer coating should next be rinsed with fresh solvent and dried.

If appropriate, such as in the production of printed circuits where the support is of copper or of other suitable electrically-conducting metal, the exposed metal is etched in a conventional manner using, e.g., ferric chloride or ammonium persulphate solutions.

The ketone may, if desired, be partially polymerised before applying it to the support, in order to improve the film-forming or mechanical properties of the irradiated product. Such a partial prepolymerisation can be effected by heating: it should not, however, proceed beyond the stage at which a correctly differentiated image is obtained on the plate when the plate is exposed. The ketone may also be heated after exposure to actinic radiation to enhance the degree of polymerisation.

The following Examples illustrate the invention. Temperatures are in degrees Celsius. The aldehydes were freshly distilled before use.

Epoxide contents were determined by titration against a 0.1 N solution of perchloric acid in glacial acetic acid in the presence of excess of tetraethylammonium bromide, crystal violet being used as the indicator.

In the Examples the reaction between the keto group of the advanced epoxide resin and the aldehyde was continued until no keto group could be detected by nuclear magnetic resonance spectroscopy. The sensitivity of this method of detection is such that if 5% or less of the keto groups remained in the unreacted state they would not be detected. In all the Examples, therefore, the ratio of $a$ to $b$ in the products of formula I is 100:5 or less.

EXAMPLE 1

A mixture of resacetophenone (20.2 g), 50 g of "Epoxide Resin I" (2,2-bis(4-glycidyloxyphenyl)propane having a 1,2-epoxide content of 5.6 equivalents per kilogram), and tetramethylammonium chloride (0.2 g) was stirred at 130° for 3 hours, by which time the mixture was very viscous. The resin was removed hot from the flask, and on cooling formed a brittle solid having a residual epoxide content of 0.35 equivalent per kilogram.

A portion of the resin (8.5 g) was ground to a powder, dissolved in furfuraldehyde (42 ml), and 7 ml of a 40% solution of benzyltrimethylammonium hydroxide in methanol was added. The mixture was stirred at 62° for 5 hours in the absence of light, by which time the solution was not noticeably basic, and the solid polymer was then precipitated by pouring the dark mixture slowly into ethanol (800 ml). The dark brown solid so obtained was dissolved in 200 ml of a 1:1 mixture by volume of dioxane and acetone and reprecipitated in water (800 ml). The resulting dark solid was washed with several portions of ethanol, dried in air, and a 15% w/w solution of the resin in cyclohexanone was prepared.

The product is substantially of formula I, where $R^1$ denotes

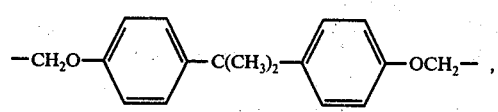

$R^3$ denotes

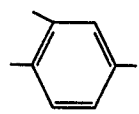

$R^2$ denotes —H,
R denotes a 2-furyl group,
$(a + b)$ denotes an integer of average value 10, and $c$ is 0.

A copper-clad laminate was coated with the solution and the solvent was allowed to evaporate, leaving a film about 10 μm thick. The film was irradiated for 3 minutes through a negative using a 500 watt medium pressure mercury lamp at a distance of 230 mm. After irradiation, the image was developed by washing in cyclohexanone which removed the unexposed areas of the film. The uncoated copper areas were etched using an aqueous solution of ferric chloride (60% w/v $FeCl_3$) containing concentrated hydrochloric acid (10% v/v), leaving a good relief image.

EXAMPLE 2

A mixture of resacetophenone (21.8 g), Epoxide Resin I (50.5 g), tetramethylammonium chloride (0.2 g), and 2-ethoxyethanol (70 g) was stirred at 130° for 20 hours, by which time the epoxide content of the solution was 0.12 equivalent per kilogram.

The solvent from 15 g of the resin solution was removed at low pressure (water vacuum pump) and the resulting solid was dissolved in furfuraldehyde (40 ml). A solution of potassium hydroxide (3 g) in water (20 ml) was added and the mixture was stirred vigorously in the absence of light. The temperature rose to 38° after several minutes and remained steady for 30 minutes. External heating was then applied and the mixture was stirred at 40° for a further hour. The dark mixture was poured slowly into ethanol (800 ml) containing acetic acid (4 g) (for neutralisation of residual base) to precipitate the solid polymer, which was removed, dissolved in chloroform (100 ml), and reprecipitated with 800 ml of petroleum ether (b.p. 40°–60°). The resulting pale yellow solid was filtered and dried.

The product is of the same composition as that in Example 1 except that $(a + b)$ represents an integer of average value 15.

The solid product (5.2 g) was dissolved in 2-ethoxyethanol to give a 35% w/w solution, which was tested as described in Example 1. A good relief image was obtained after 3 minutes' irradiation and development in cyclohexanone.

EXAMPLE 3

A mixture of resacetophenone (7.11 g), 1,5-bis(4-glycidyloxyphenyl)-penta-1,4-dien-3-one (20.5 g), tetramethylammonium chloride (0.08 g), and 2-ethoxyethanol (30 g) was stirred at 130° for 5 hours, by which time the epoxide content of the solution was 0.4 equivalent per kilogram.

The solvent from 17.5 g of the polymer solution was removed at low pressure and the solid resin was dissolved in furfuraldehyde (52 ml). To this solution was added 6 ml of a 40% solution of benzyltrimethylammonium hydroxide in methanol and the mixture was stirred at 60° for 5½ hours in the dark. (The mixture was not appreciably basic after this time.) The product was precipitated by pouring the dark mixture slowly into ethanol (800 ml), and the yellow-brown solid was removed and dried in the atmosphere.

The product is substantially of formula I, where $R^1$ denotes

$R^3$ denotes

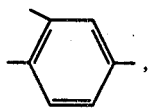

$R^2$ denotes -H,
R denotes a 2-furyl group,
($a + b$) denotes an integer of average value 3, and $c$ is 0.

A 30% solution w/w of the polymer in cyclohexanone was prepared and tested according to Example 1. A good relief image was obtained after 2 minutes' exposure and development in cyclohexanone.

EXAMPLE 4

A mixture of resacetophenone (15.1 g), 1,3-diglycidyl-5,5-dimethylhydantoin (25 g), and tetramethylammonium chloride (0.15 g) was stirred at 140° for 3 hours. The resin was removed from the flask while hot and cooled to give a brittle solid having an epoxide content of 0.6 equivalent per kilogram.

A portion (7 g) of the solid was ground to a powder and dissolved in furfuraldehyde. A solution of potassium hydroxide (1.5 g) in water (10 ml) was added, and the mixture was stirred vigorously in the absence of light. The temperature rose to 33° and remained steady for 50 minutes, after which time the polymer was precipitated by pouring the orange mixture slowly into ethanol (600 ml) containing acetic acid (2 g) to neutralise the remaining base. The resulting yellow solid was dissolved in chloroform (60 ml) and reprecipitated from 800 ml of petroleum ether (b.p. 40°-60°), giving a light yellow solid which was dried. Examination of its n.m.r. spectrum showed the virtual absence of acetyl groups, i.e., substantially complete substitution had occurred. In this and succeeding Examples, where the reaction time was shorter and the reaction temperature lower than in the first three Examples, the products were generally lighter coloured.

The product is substantially of formula I, where $R^1$ denotes

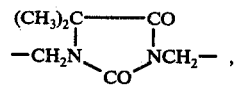

$R^3$ denotes

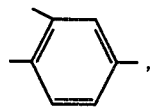

$R^2$ denotes —H,
R denotes a 2-furyl group,
($a + b$) denotes an integer of average value 6, and $c$ denotes 0.

A 40% w/w solution of the product in 2-ethoxyethanol was prepared and tested as described in Example 1. After 1 minute's irradiation and development in cyclohexanone, a good relief image was obtained.

EXAMPLE 5

A portion (6 g) of the resin prepared from resacetophenone and 1,3-diglycidyl-5,5-dimethylhydantoin as described in Example 4 was dissolved in cinnamaldehyde (40 ml) containing 2-ethoxyethanol (10 ml). A solution of potassium hydroxide (1.5 g) in water (10 ml) was added, and the mixture was stirred vigorously in the absence of light. The temperature rose to 35° after a few minutes, and after stirring at this temperature for 50 minutes, the orange mixture was poured slowly into ethanol (600 ml) containing acetic acid (2.0 g) for neutralisation of the remaining base. The precipitated yellow polymer was dissolved in chloroform (70 ml) and reprecipitated from 600 ml of petroleum ether (b.pt. 40°-60°) to give a yellow solid which was dried. Inspection of the n.m.r. spectrum showed that substantially complete reaction had taken place.

The product is of the same formula as that obtained in Example 4 except that R denotes a 2-phenylvinyl group.

A 40% solution w/w of the solid in 2-ethoxyethanol was prepared and tested as described in Example 1. A good relief image was obtained after 2 minutes' irradiation and development in cyclohexanone.

EXAMPLE 6

To 3 g of a 40% solution in 2-ethoxyethanol of the polymer prepared in Example 4 was added dicyandiamide (0.06 g). A copper-clad laminate was coated with the composition and the solvent was allowed to evaporate, leaving a film which was irradiated through a negative as described in Example 1 and developed in cyclohexanone to give a good relief image on the copper. The plate was heated at 180° for 2 hours; the coating of the polymer in the image areas had very good adhesion to the copper and excellent solvent resistance; thus, it passed the standard acetone rub test, i.e, 20 rubs with a cotton-wool swab soaked in acetone did not remove any of the coating.

EXAMPLE 7

A mixture of resacetophenone (7.6 g), 1,4-butanediol diglycidyl ether (10.9 g), and tetramethylammonium chloride (0.02 g) was slowly heated to 150° and stirred at this temperature for 2½ hours. The viscous brown liquid was poured hot from the flask and on cooling gave a slightly tacky solid having an epoxide content of 0.35 equivalent per kilogram.

A portion of this resin (7 g) was dissolved in furfuraldehyde (40 ml) and a solution of potassium hydroxide (1.5 g) in water (10 ml) was added. The mixture was stirred vigorously in the absence of light at 38° for 45 minutes, and the polymer was precipitated by pouring the mixture slowly into ethanol (800 ml) containing acetic acid (1.5 g). The product was dissolved in chloroform (80 ml) and reprecipitated from petroleum ether (500 ml, b.p. 40°-60°) to give a yellow solid.

The product is substantially of formula I, where
$R^1$ denotes $-CH_2O(CH_2)_4OCH_2-$,
$R^3$ denotes

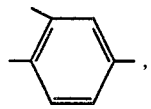, $R^2$ denotes $-H$,
R denotes a 2-furyl group,
($a + b$) denotes an integer of average value 14, and c is 0.

A 30% solution (w/w) of the product in 2-ethoxyethanol was prepared and tested as described in Example 1. A good relief image was obtained after 10 minutes' irradiation and development in cyclohexanone.

We claim:
1. An unsaturated ketone of the formula

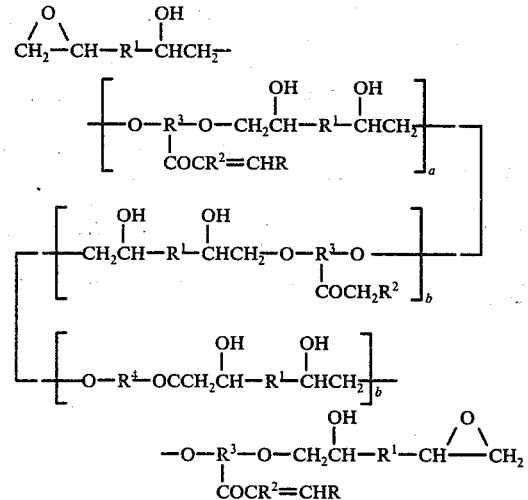

where
R represents a monovalent alkenyl, aralkenyl, cycloalkenyl, cycloalkylalkenyl, cycloalkenylalkenyl, heterocyclic or heterocyclic-alkenyl group of up to 20 carbon atoms having ethylenic unsaturation or heterocyclic aromaticity in conjugation with the indicated ethylenic double bond, $R^1$ represents a carbon-carbon bond or a divalent, optionally substituted or interrupted, hydrocarbyl residue, $R^2$ represents a hydrogen, chlorine, or bromine atom, a cyano group, or an aliphatic, aromatic, cycloaliphatic, araliphatic, cycloaliphatic-aliphatic, heterocyclic or heterocyclic-aliphatic group of 1 to 10 carbon atoms, $R^3$ represents a trivalent aromatic or heterocyclic group bound directly through three carbon atoms thereof to the two indicated $$-OCH_2CH- \atop \phantom{-OCH_2C}OH$$

and the indicated $-COCR^2=CHR$ groups, $R^4$ represents the residue, free of any substituent of formula $-COCH_2R^2$ or $-COCR^2=CHR$, of a dihydric phenol after removal of both phenolic hydroxyl groups, and $a$, $b$, and $c$ each represent zero or an integer such that the average molecular weight of the unsaturated ketone of formula I is from 500 to 50,000.

2. A ketone of claim 1, in which R is an aralkenyl, heterocyclic or heterocyclic-alkenyl group consisting only of carbon and hydrogen atoms and, where appropriate, hetero nitrogen, oxygen, or sulfur atoms.

3. A ketone of claim 1, in which $R^1$ represents a residue where both the epoxide groups were present in glycidyl groups attached to oxygen, nitrogen, or sulfur atoms.

4. A ketone of claim 3, in which $R^1$ denotes a chain of carbon atoms containing a grouping

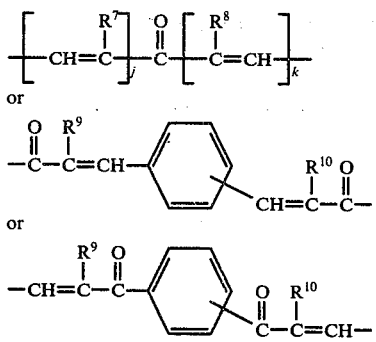

where
$R^7$ and $R^8$ individually are each a hydrogen atom, an alkyl group of 1 to 4 carbon atoms, or a phenyl group, and conjointly denote a polymethylene chain of 2 to 4 methylene groups, $R^9$ and $R^{10}$ are each a hydrogen atom, an alkyl group of 1 to 4 carbon atoms, or a phenyl group, and $j$ and $k$ are each zero, 1, or 2, but cannot both be zero.

5. A ketone of claim 1, in which $R^3$ represents a group of from 5 to 20 carbon atoms and containing one or two benzenoid rings or heterocyclic rings which have ($4n + 2$) $\pi$-electrons, where $n$ is the number of said rings.

6. A ketone of claim 5, in which $R^3$ represents a group of formula

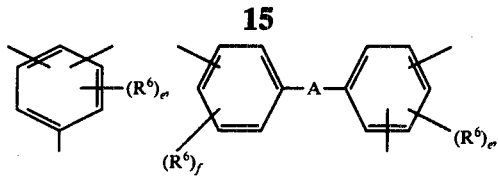

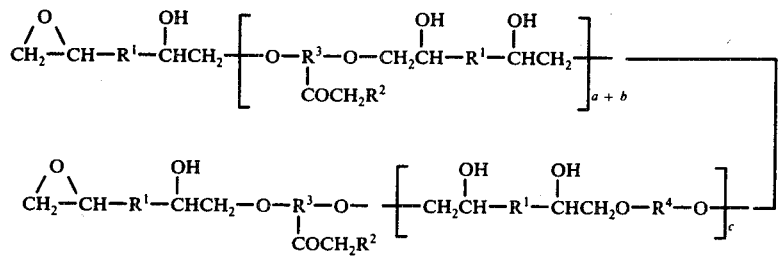

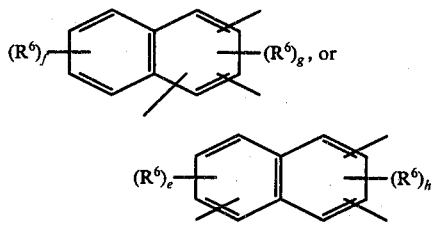

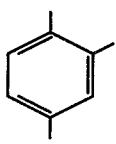

wherein
R⁶ represents a halogen atom, an alkyl, aryl, or aralkyl group of 1 to 8 carbon atoms, or a group of formula —COCR²=CHR
A represents a carbon-carbon bond, an oxygen or sulfur atom, a carbonyl, sulfonyl, or sulfinyl group, or a divalent aliphatic, aromatic, or araliphatic group of 1 to 10 carbon atoms,
$e$ represents 0 or an integer of from 1 to 3,
$f$ represents 0 or an integer of from 1 to 4,
$g$ represents 0 or 1, and
$h$ represents 0, 1, or 2.

7. A ketone according to claim 6, in which R³ is a group of formula and $b$, and $c$, each represent 0.

8. A ketone according to claim 1, in which $a$, $b$, and $c$ are each such that the average molecular weight is from 2000 to 10,000.

9. A process for the preparation of an unsaturated ketone as claimed in claim 1, which comprises condensation of an advanced epoxide resin of formula with an aldehyde of formula

R — CHO     XIII

10. The process of claim 9, carried out in the presence of an acidic dehydration catalyst.

11. The process of claim 9, carried out in the presence of a basic condensation catalyst.

12. The process of claim 9, carried out in the presence of an excess of the aldehyde of formula XIII.

13. A process for the preparation of an unsaturated ketone as claimed in claim 1, which comprises advancement of a diepoxide of formula,

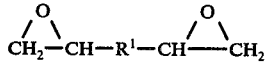

with a dihydric phenol of formula

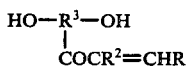

14. The process of claim 13, in which there is also used a dihydric phenol of formula

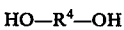

15. The process of claim 13, carried out in the presence of a catalyst for advancing epoxide resins.

16. The process of claim 15, in which the catalyst is a quaternary ammonium salt.

17. A plate, sensitive to actinic radiation, comprising a support carrying a layer of an unsaturated ketone as claimed in claim 1.

18. A plate according to claim 17, which further carries a heat-curing agent for epoxide resins.

19. A plate according to claim 18, in which the curing agent is a polycarboxylic acid anhydride, dicyandiamide, a boron difluoride chelate, or is a complex of a tertiary amine with boron trifluoride or with boron trichloride.

* * * * *